United States Patent [19]

Usami et al.

[11] Patent Number: 4,970,687
[45] Date of Patent: Nov. 13, 1990

[54] SEMICONDUCTOR MEMORY DEVICE HAVING A TIMING GENERATOR CIRCUIT WHICH PROVIDES A WRITE PULSE SIGNAL WHICH HAS AN OPTIONAL TIMING RELATIONSHIP WITH THE CHIP SELECT SIGNAL

[75] Inventors: Masami Usami, Ohme; Kazuhiro Akimoto, Tokorozawa; Takeo Uchiyama, Ohme; Masato Iwabuchi, Hachioji, all of Japan

[73] Assignee: Hitachi, Ltd., Tokyo, Japan

[21] Appl. No.: 203,936

[22] Filed: Jun. 8, 1988

[30] Foreign Application Priority Data

Jun. 10, 1987 [JP] Japan ................................. 62-143063

[51] Int. Cl.$^5$ ....................... G11C 7/00; G11C 11/411; G11C 11/413
[52] U.S. Cl. ........................... 365/189.01; 365/189.05; 365/230.08; 365/193; 365/233
[58] Field of Search ............... 365/230, 233, 289, 174, 365/177, 191, 193, 230.01, 230.08, 189.01, 189.05, 233.5; 307/234

[56] References Cited

U.S. PATENT DOCUMENTS

| | | | |
|---|---|---|---|
| 4,335,449 | 6/1982 | Nokabo | 365/177 |
| 4,713,796 | 12/1987 | Ogiue et al. | 365/177 X |
| 4,766,572 | 8/1988 | Kobayashi | 365/233 X |
| 4,802,131 | 1/1989 | Toyoda | 365/233 X |

FOREIGN PATENT DOCUMENTS

58-60487  4/1983  Japan .

Primary Examiner—Stuart N. Hecker
Assistant Examiner—Alyssa H. Bowler
Attorney, Agent, or Firm—Antonelli, Terry, Stout & Kraus

[57] ABSTRACT

A bipolar type RAM having latches which accept and hold address signals, input write data and a write enable signal supplied from outside of the corresponding RAM chip, in accordance with strobe signals, and a timing generator circuit which forms the strobe signals and a write pulse required for a write operation and satisfying predetermined timing conditions, on the basis of a chip select signal supplied from outside.

25 Claims, 4 Drawing Sheets

SEMICONDUCTOR MEMORY DEVICE HAVING A TIMING GENERATOR CIRCUIT WHICH PROVIDES A WRITE PULSE SIGNAL WHICH HAS AN OPTIONAL TIMING RELATIONSHIP WITH THE CHIP SELECT SIGNAL

BACKGROUND OF THE INVENTION

This invention relates to semiconductor memory devices, and more particularly to techniques which are effective when utilized in, for example, a bipolar type RAM (random access memory) which is constructed on the basis of an ECL (emitter-coupled logic) circuit.

A bipolar type RAM constructed on the basis of an ECL circuit is employed as, for example, the cache memory or stack memory of a high-speed computer. Therefore, a high operating speed is required of such a bipolar type RAM. The bipolar type RAM is brought into a selected state in accordance with a chip select signal $\overline{CS}$ which is supplied as a control signal from outside by way of example. Further, in the bipolar type RAM brought into the selected state, the operation of writing data into a selected memory cell is selectively executed in accordance with a write enable signal $\overline{WE}$.

The bipolar type RAM is described in, for example, the official gazette of Japanese Patent Application Laid-open No. 60487/1983.

SUMMARY OF THE INVENTION

Figure 4:
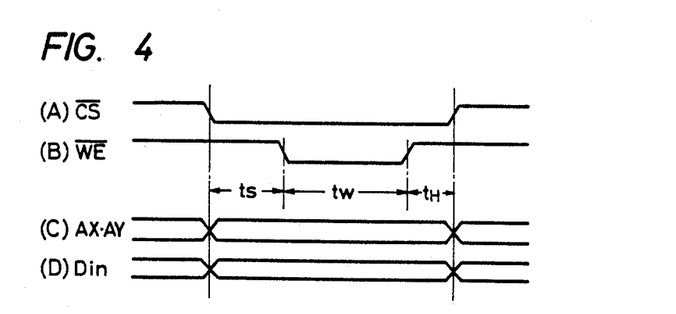
FIG. 4 is a timing chart showing the operation timings of the bipolar type RAM.

It has been revealed by the inventors that the bipolar type RAM poses a problem stated below as the access time thereof is shortened to shorten the machine cycle of a computer system or the like including this bipolar type RAM. As shown in FIG. 4, the write enable signal $\overline{WE}$ which is supplied to the bipolar type RAM must have a pulse width of at least $t_W$ must ensure a predetermined setup time $t_S$ and hold time $t_H$ for the chip select signal $\overline{CS}$, address signals AX and AY, and input write data Din. The timing conditions of the write enable signal $\overline{WE}$ are becoming still shorter and more restrictive as the operating speed of the bipolar type RAM is enhanced thereby further reducing the memory cycle of the computer.

On the other hand, stray capacitances and wiring resistances of comparatively large values exist in a packaging board on which the bipolar type RAM is installed, and wiring leads which are laid among individual packaging boards. Accordingly, the control signals, such as the write enable signal $\overline{WE}$, which have been formed outside the bipolar type RAM are delayed and have their signal waveforms distorted by the stray capacitances, etc. By way of example, on the packaging board, signal wiring for transmitting the address signals AX and AY to the bipolar type RAM and signal wiring for transmitting the write enable signal $\overline{WE}$ thereto are signal wiring leads different from each other. Therefore, the delay of the signal attributed to the wiring for transmitting the address signal and the signal delay attributed to the wiring for transmitting the write enable signal are unequal. As a result, the write enable signal which satisfactorily meets the timings described above would be difficult to satisfactorily provide from outside of the bipolar type RAM. As the operating speed of the bipolar type RAM is raised to shorten the memory cycle of the computer, the pulse widths of the control signals such as the write enable signal $\overline{WE}$ are made shorter and become more susceptible to the stray capacitances, etc.

For these reasons, it has become difficult to form outside the bipolar type RAM the write enable signal $\overline{WE}$ which can conform to the severe timing conditions as described above. It has also become difficult to realize the signal path itself for supplying the write enable signal $\overline{WE}$ of short pulse width from outside to the bipolar type RAM. Therefore, notwithstanding that the speed of the internal operation of the bipolar type RAM is further enhanced, it is difficult to shorten the machine cycle of the computer system or the like including that of the bipolar type RAM, and this difficulty forms a cause for hampering enhancement in the throughput of the system.

An object of this invention is to provide a semiconductor memory device such as bipolar type RAM, which has its operating speed raised while moderating the timing conditions of signals.

The above and other objects and novel features of this invention will become apparent from the description of the specification and the accompanying drawings.

The outline of a typical aspect of performance of this invention is briefly explained as follows:

A semiconductor memory device such as bipolar type RAM is equipped with latches for accepting and holding address signals, input write data, and a write enable signal which are supplied from outside, in accordance with strobe signals, and a timing generator circuit for forming the strobe signals, a write pulse required for a write operation and satisfying predetermined timing conditions, and so forth on the basis of a start control signal (chip select signal) which is supplied from outside. Thus, the write pulse subject to the comparatively severe timing conditions can be formed inside the bipolar type RAM comparatively easily, and the time relations of the write pulse to the start control signal, etc. can be optimalized. Therefore, shortening a memory cycle can be achieved while the malfunctions of the semiconductor memory device such as bipolar type RAM are prevented.

DESCRIPTION OF THE PREFERRED EMBODIMENTS

Figure 2:
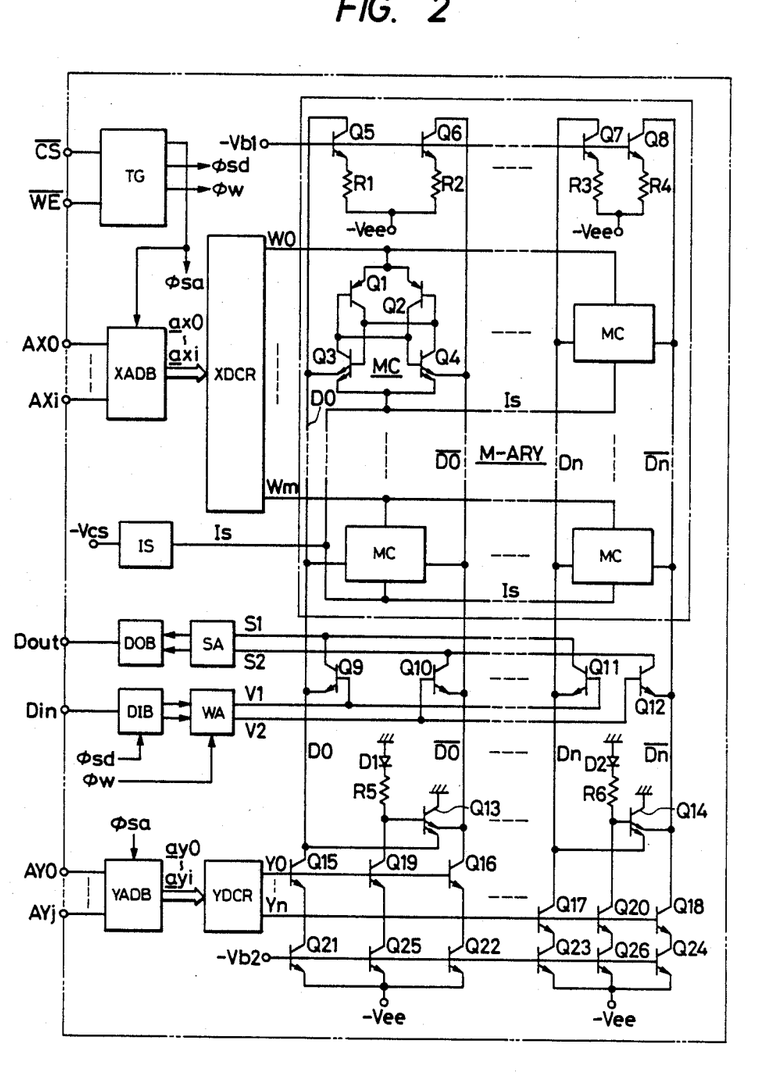
FIG. 2 is a circuit block diagram showing an embodiment of a bipolar type RAM which includes the timing control circuit in FIG. 1.

Shown in FIG. 2 are the circuit blocks of one embodiment of a bipolar type RAM to which this invention is applied. Although not especially restricted thereto, circuit elements constituting the various circuit blocks of the bipolar type RAM enclosed with a two-dot chain line in the figure are formed on a single semiconductor substrate such as of single-crystal silicon by the manufacturing techniques of known semiconductor integrated circuits of the bipolar type. In the figure, symbols $\overline{CS}$, $\overline{WE}$, AX0–AXi, Dout, Din, and AY0–AYj indicate the external terminals of the bipolar type RAM, respectively.

Although not especially restricted thereto, the bipolar type RAM of this embodiment is basically constructed of an ECL circuit and is employed as any of the cache memory, stack memory, etc. of a high-speed computer system. Accordingly, the access time of the bipolar type RAM is rendered very short and is accessed in a short memory cycle. The bipolar type RAM of this embodiment is supplied with a chip select signal $\overline{CS}$ serving as a start control signal through the external terminal $\overline{CS}$, and with a write enable signal $\overline{WE}$ serving as a write control signal through the external terminal $\overline{WE}$. In addition, it is supplied with address signals through the external terminals AX0–AXi and AY0–AYj and with input write data through the data input terminal Din. The bipolar type RAM of this embodiment is provided with latches which accept and hold the write enable signal $\overline{WE}$, the address signals and the input write data in accordance with strobe signals, and with a timing generator circuit TG which forms the strobe signals in accordance with the chip select signal $\overline{CS}$. A write pulse required for the write operation of the bipolar type RAM is autonomously formed on the basis of the chip select signal $\overline{CS}$ by the timing generator circuit TG. Therefore, a controller located outside, not shown, may apply the write enable signal $\overline{WE}$ substantially simultaneously with the chip select signal $\overline{CS}$ and need not be conscious of the setup time as well as hold time and the pulse width of the write enable signal $\overline{WE}$ with respect to the chip select signal $\overline{CS}$, the address signals and the input write data. Thus, the bipolar type RAM of this embodiment has the timing conditions of the write enable signal moderated and can shorten the memory cycle.

Referring to FIG. 2, a memory array M-ARY includes (m+1) word lines W0–Wm which are extended in the horizontal direction in the figure, (n+1) sets of complementary data lines D0, $\overline{D0}$–Dn, $\overline{Dn}$ which are extended in the vertical direction in the figure, and (m+1)×(n+1) memory cells MC which are arranged in a lattice shape at the intersection points between the word lines and the complementary data lines.

Although not especially restricted thereto, each of the memory cells MC is constructed, as exemplified in FIG. 2, of a flip-flop circuit configured of N-P-N type drive transistors Q3 and Q4 the bases and collectors of which are cross-connected to each other, and P-N-P type load transistors Q1 and Q2 which are respectively connected to the collectors of the drive transistors. Although no special restriction is intended, each of the drive transistors Q3 and Q4 of the memory cell MC is formed into a multi-emitter structure which has two emitters. Of such emitters, one of the drive transistor Q3 and one of the drive transistor Q4 are connected in common and are further coupled to a holding current supply line Is. The other emitters of the drive transistors Q3 and Q4 are used as the input/output terminals of the memory cell MC, and are respectively coupled to the non-inverted signal line and inverted signal line of the complementary data lines (bit lines or digit lines) D0 and $\overline{D0}$. The emitters of the load transistors Q1 and Q2 of the memory cell MC are connected in common, and are further coupled to the corresponding word line W0. Likewise, the input/output terminals of the (m+1) memory cells MC arranged in the same column of the memory array M-ARY are respectively coupled in common to the non-inverted signal line and inverted signal line of the corresponding set of the complementary data lines D0, $\overline{D0}$–Dn, $\overline{Dn}$. In addition, the common-connected emitters of the load transistors of the (n+1) memory cells MC arranged in the same row of the memory array M-ARY are respectively coupled in common to the corresponding one of the word lines W0–Wm. The common-connected one-side emitters of the drive transistors Q3 and Q4 of all the memory cells MC are coupled to the holding current supply line Is in common. The holding current supply line Is is further coupled to a holding current supply circuit IS.

Although not especially restricted thereto, the holding current supply circuit IS receives a reference potential $-V_{cs}$ formed by a voltage generator circuit, not shown, and has the function of causing a predetermined storage holding current to flow to the memory cells MC. The storage holding current is kept flowing steadily even when the bipolar type RAM is in the non-selected state. Therefore, the value of the current is set at such a comparatively small value that the memory cells MC can hold stored data.

The word lines W0–Wm constituting the memory array M-ARY are coupled to an X-address decoder XDCR. Among them, one word line designated by X-address signals AX0–AXi is brought into a selected state of high level in an alternative way.

The X-address signals AX0–AXi supplied from outside are supplied to an X-address buffer XADB through the external terminals AX0–AXi. The X-address buffer XADB is basically constructed of address latches of (i+1) bits which are provided in correspondence with the respective X-address signals AX0–AXi. These latches are supplied with a timing signal $\phi_{sa}$ in common from the timing generator circuit TG. As will be described later, the timing signal $\phi_{sa}$ is rendered a low level in the non-selected state of the bipolar type RAM. In contrast, in a case where the chip select signal $\overline{CS}$ has been rendered the low level to bring the bipolar type RAM into the selected state, the timing signal $\phi_{sa}$ is temporarily rendered the high level upon lapse of a predetermined period of time since the establishment of the selected state. The respective address latches of the X-address buffer XADB accept and hold the corresponding X-address signals AX0–AXi in accordance with the timing signal $\phi_{sa}$. The non-inverted output signals and inverted output signals of these address latches are supplied to the X-address decoder XDCR as complementary internal address signals ax0–axi. (Here, the non-inverted internal address signal $ax\overline{0}$ and the inverted internal address signal $\overline{ax0}$, for example, are expressed as the complementary internal address signal ax0 in combination. The same applies to the subsequent address signals.)

The X-address decoder XDCR decodes the complementary internal address signals ax0–axi supplied from the X-address buffer XADB, and brings one word line designated by the X-address signals AX0–AXi, into the selected state of the high level.

Meanwhile, as typically shown by the complementary data lines D0, $\overline{D0}$ and Dn, $\overline{Dn}$ in FIG. 2, the complementary data lines D0, $\overline{D0}$–Dn, $\overline{Dn}$ constituting the memory array M-ARY are respectively coupled to the collectors of corresponding transistors Q21, Q22–Q23, Q24 through corresponding column-switching transistors Q15, Q16–Q17, Q18. These transistors Q21, Q22–Q23, Q24 have their emitters fed with the power source voltage (minus supply voltage) $-V_{ee}$ of the circuitry, and have their bases fed with a predetermined bias voltage $-V_{b2}$. Thus, the bipolar transistors Q21, Q22–Q23, Q24 function as regulated current sources for write and read operations, respectively.

The bases of the column-switching bipolar transistors Q15, Q16–Q17, Q18 are respectively supplied with corresponding data line select signals YO–Yn from a Y-address decoder YDCR to be described later. These data line select signals YO–Yn are ordinarily held in non-selected states of the low level, and they are alternatively brought into selected states of the high level when Y-address signals AYO–AYj are set in corresponding combinations.

The Y-address signals AYO–AYj supplied from outside are supplied to a Y-address buffer YADB through the external terminals AYO–AYj. Likewise to the X address buffer XADB, the Y-address buffer YADB is basically constructed of address latches of (j+1) bits which are provided in correspondence with the respective Y-address signals AYO–AYj. These address latches are supplied with the timing signal $\phi_{sa}$ in common from the timing generator circuit TG. The respective address latches of the Y-address buffer YADB accept and hold the corresponding Y-address signals AYO–AYj in accordance with the timing signal $\phi_{sa}$. The non-inverted output signals and inverted output signals of these address latches are supplied to the Y-address decoder YDCR as complementary internal address signals ayO–ayj.

The Y-address decoder YDCR decodes the complementary internal address signals ayO–ayj supplied from the Y-address buffer YADB, and brings one of the data line select signals YO–Yn designated by the Y-address signals AYO–AYj, into the alternate or selected state of the high level. Thus, among the column switching transistors Q15, Q16–Q17, Q18, the pair of column switching transistors corresponding to the data line select signal brought into the selected state are selectively turned "on."

In this embodiment, although no special restriction is intended, bias circuits to be described below are provided in order that the complementary data lines to be brought into non-selected states may have a predetermined bias voltage applied thereto. The complementary data lines DO, $\overline{DO}$–Dn, $\overline{Dn}$ are, on the one hand, coupled to the power source voltage $-V_{ee}$ of the circuitry through corresponding transistors Q5, Q6–Q7, Q8 and resistors R1, R2–R3, R4. The gates of the transistors Q5, Q6–Q7, Q8 are connected in common, and are fed with a predetermined bias voltage $-V_{b1}$ from a voltage generator circuit not shown. Thus, the transistors Q5, Q6–Q7, Q8 and the resistors R1, R2–R3, R4 function as regulated current sources, respectively, and they operate to normally absorb minute currents of fixed value from the corresponding complementary data lines DO, $\overline{DO}$–Dn, $\overline{Dn}$.

The complementary data lines DO, $\overline{DO}$–Dn, $\overline{Dn}$ are, on the other hand, coupled to the first and second emitters of corresponding N-P-N type bipolar transistors Q13–Q14, respectively. The collectors of these transistors Q13–Q14 are coupled to the ground potential of the circuitry, and a diode D1 and a resistor R5–a diode D2 and a resistor R6 connected in series with each other are respectively interposed between the bases and collectors of the transistors Q13–Q14, namely, between the bases thereof and the ground potential of the circuitry.

The bases of the transistors Q13–Q14 are further coupled to the collectors of transistors Q25–Q26 through column switching transistors Q19–Q20 disposed in parallel with the column switching transistors Q15, Q16–Q17, Q18, respectively. The transistors Q25–Q26 have their emitters coupled to the power source voltage $-V_{ee}$ of the circuitry and receive the bias voltage $-Vb2$ at their bases, thereby to function as regulated current sources, respectively. The bias voltage $-Vb2$ is formed by a voltage generator circuit which is not shown in FIG. 2.

When the complementary data lines are to be brought into the non-selected states, the data line select signal corresponding thereto is rendered the non-selected state of the low level. Thus, among the column switching transistors Q19–Q20, one corresponding to the complementary data lines to be brought into the non-selected states is turned "off." In consequence, the potentials of the non-inverted signal lines and inverted signal lines of the respective complementary data lines in the non-selected states are biased to a voltage which is substantially equal to the sum between the forward voltage of the diodes D1–D2 and the base-emitter forward voltage of the transistors Q13–Q14. On the other hand, when the complementary data lines are to be brought into the selected states, one of the column switching transistors Q19–Q20 corresponding to the complementary data lines is, in the alternative, turned "on". Thus, a comparatively large current is caused to flow from one of the transistors Q25–Q26 corresponding to the complementary data lines in the selected states, to the corresponding one of the resistors R5–R6 through the corresponding one of the transistors Q19–Q20. Then, the corresponding one of the transistors Q13–Q14 is, in the alternative turned "off", and the levels of the complementary data lines of the corresponding set become potentials which conform to stored information held in the selected memory cell. On this occasion, the corresponding ones of the other column-switching transistors Q15, Q16–Q17, Q18 are selectively turned "on," and comparatively large currents are caused to flow to the corresponding ones of the complementary data lines DO, $\overline{DO}$–Dn, $\overline{Dn}$ through the corresponding ones of the transistors Q21, Q22–Q23, Q24. In addition, the (n+1) memory cells MC coupled to the selected word line are supplied with operating currents of comparatively large value owing to the high level of the corresponding word line. Thus, while both the levels of the non-inverted signal line and inverted signal line of the selected complementary data lines are rising, the difference of the levels is expanded.

Further, the complementary data lines DO, $\overline{DO}$–Dn, $\overline{Dn}$ are respectively provided with current switching transistors Q9, Q10–Q11, Q12 whose emitters are coupled to the non-inverted signal lines and inverted signal lines of the corresponding complementary data lines as exemplified in FIG. 2. The collectors of these current switching transistors Q9, Q10–Q11, Q12 are respectively coupled to complementary signal lines S1 and S2 in common, and are further coupled to the input terminals of a sense amplifier SA. Likewise, the bases of these current switching transistors Q9, Q10–Q11, Q12 are coupled to complementary signal lines V1 and V2 in common and are further coupled to the output terminals of a write amplifier WA. In the case where the bipolar type RAM has been brought into a read operation mode, the levels of both the complementary signal lines V1 and V2 are set so as to become substantially equal to the intermediate potential between the read signal levels of the complementary data lines conforming to the stored data of the selected memory cell MC and are used as a reference potential in the read operation. That is, a potential which is substantially intermediate between the read signal level of one complementary data line (for example, DO) and that of the other complementary data line ($\overline{DO}$) to arise when the stored data is read out from the memory cell MC is supplied from the complementary signal lines V1 and V2 to the bases of the transistors Q9, Q10–Q11, Q12. On this occasion, the transistors Q9, Q10–Q11, Q12 are connected in a differential form along with the drive transistors Q3 and Q4 of the corresponding memory cells MC, and read currents conforming to the stored data of the selected memory cell MC are supplied to the sense amplifier SA through the complementary signal lines S1 and S2. On the other hand, in a case where the bipolar type RAM has been brought into a write operation mode, the transistors Q9, Q10–Q11, Q12 are similarly connected in the differential form along with the drive transistors Q3 and Q4 of the corresponding memory cells MC. Besides, on this occasion, the complementary signal lines V1 and V2 are complementarily set at a level above the high level of the holding voltage of the selected memory cell and a level below the low level thereof, in accordance with write data supplied through a data input buffer DIB from the data input terminal Din. Thus, the drive transistors of the selected memory cell are respectively turned "on" and "off" in response to the levels of the complementary signal lines V1 and V2. In this way, the stored data of the memory cell MC is rewritten according to the write data supplied from outside.

The sense amplifier SA amplifies the read signals transmitted thereto through the complementary signal lines S1 and S2, converts the levels of the signals, and thereafter sends the signals to a data output buffer DOB. The data output buffer DOB delivers the read signals provided from the sense amplifier SA, to the data output terminal Dout through open-emitter output transistors.

The data input buffer DIB includes a data latch of 1 bit for holding the input write data. This data latch is supplied with a timing signal $\phi_{sd}$ from the timing generator circuit TG. The timing signal $\phi_{sd}$ is kept at the low level while the bipolar type RAM is in the non-selected state. In contrast, in a case where the chip select signal $\overline{CS}$ has been rendered the low level to bring the bipolar type RAM into the selected state, the timing signal $\phi_{sd}$ is temporarily kept at the high level upon lapse of a predetermined period of time since the establishment of the selected state. The data input buffer DIB accepts and holds the input write data supplied through the data input terminal Din from outside, in its data latch in accordance with the timing signal $\phi_{sd}$. The write data accepted in the data latch is subjected to level conversion, and is thereafter supplied to the write amplifier WA as complementary write signals.

The write amplifier WA is supplied with a timing signal $\phi_w$ as a write pulse from the timing generator circuit TG. The timing signal $\phi_w$ is kept at the low level while the bipolar type RAM is in the non-selected state, and it is temporarily kept at the high level for a predetermined time interval upon lapse of a predetermined period of time since the bipolar type RAM has been brought into the selected state by rendering the chip select signal $\overline{CS}$ the low level. When the bipolar type RAM has been brought into the write operation mode and the timing signal $\phi_w$ has been temporarily set at the high level, the write amplifier WA brings the levels of the respective complementary signal lines V1 and V2 to levels which conform to the complementary write signals supplied through the data input buffer DIB. Besides, when the bipolar type RAM has been brought into the read operation mode and the timing signal $\phi_w$ has been set at the low level, the write amplifier WA sets the levels of both the complementary signal lines V1 and V2 at the intermediate level which serves as the read reference potential.

As will be stated later, the timing generator circuit TG forms the timing signals $\phi_{sa}$, $\phi_{sd}$ and $\phi_w$ on the basis of the chip select signal $\overline{CS}$ and write enable signal $\overline{WE}$ supplied as the control signals from outside and supplies them to the various circuits. In addition, the timing generator circuit TG includes a latch circuit for accepting and holding the write enable signal $\overline{WE}$. This latch circuit is triggered by an internal strobe signal which is formed simultaneously with the timing signals $\phi_{sa}$ and $\phi_{sd}$, and it is selectively set or reset according to the write enable signal $\overline{WE}$. The timing signal $\phi_w$ which is used as the write pulse is selectively formed according to the output signal of this latch.

A practicable circuit arrangement of the timing generator circuit TG and the operation thereof will be described in detail below.

Figure 1:
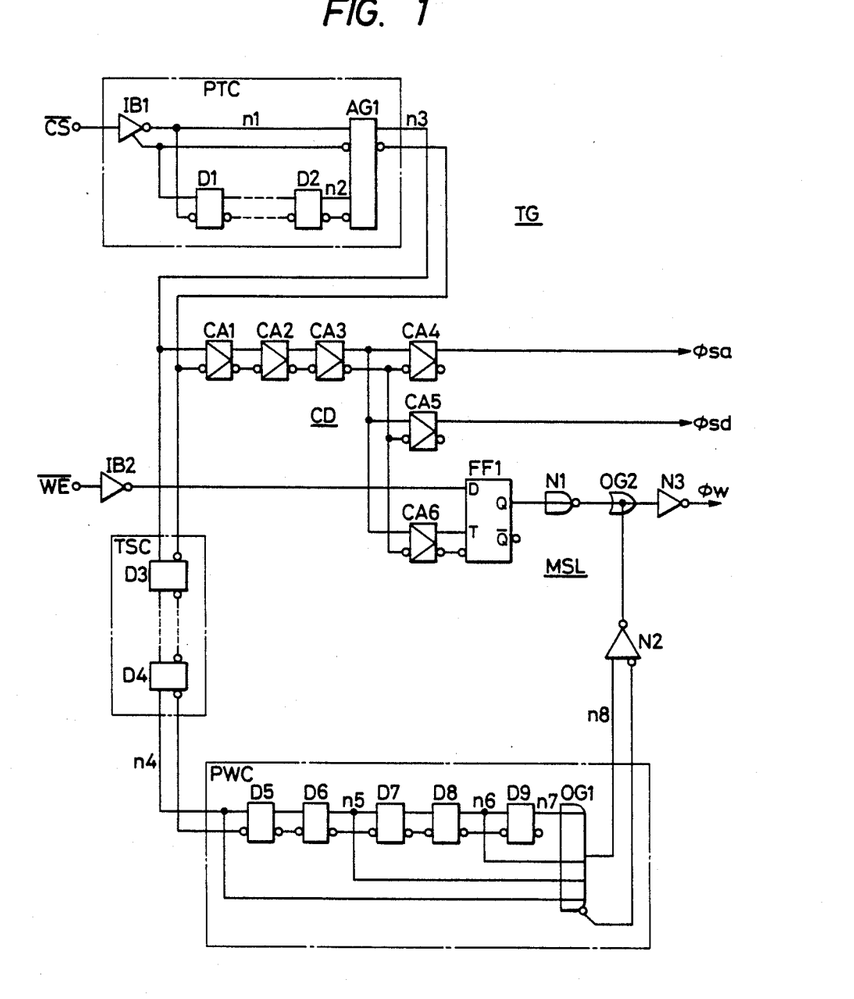
FIG. 1 is a circuit diagram showing an embodiment of that timing control circuit of a bipolar type RAM to which this invention is applied.

Shown in FIG. 1 is a circuit diagram of an embodiment of the timing generator circuit TG of the bipolar type RAM in FIG. 2. In the timing generator circuit TG, a partial circuit for forming the timing signals $\phi_{sa}$, $\phi_{sd}$ and $\phi_w$, stated above, is illustrated in FIG. 1. The circuit arrangement and operation of the remaining circuit of the timing generator circuit TG shall be omitted from the illustration and description for the sake of brevity.

Although not especially restricted thereto, the timing generator circuit TG of the bipolar type RAM in this embodiment includes a pulse transformation circuit PTC, a clock distribution circuit CD, a timing setting circuit TSC, a pulse time width setting circuit PWC and a mode selection circuit MSL. These circuits are configured of delay circuits and various logical gate circuits which are basically constructed of current switch circuits including bipolar type differential transistors.

Referring to FIG. 1, the chip select signal $\overline{CS}$ (start control signal) supplied through the external terminal $\overline{CS}$ is applied to the input buffer IB1 of the pulse transformation circuit PTC via an input protection circuit not shown.

The input buffer IB1 inverts the chip select signal $\overline{CS}$ and converts the level of the inverted signal so as to form an output signal n1. (Here, the output signal of each of input buffers and various logical gate circuits is composed of complementary output signals being a non-inverted output signal and an inverted output signal, but the level of the non-inverted output signal of the complementary output signals shall be representatively mentioned and explained in order to avoid confusion. The same applies to the ensuing description.) The output signal n1 of the input buffer IB1 is supplied to one input terminal of an AND gate circuit AG1. Further, it is inverted, and the inverted signal is supplied to the input terminal of a delay circuit which is configured of delaying gate circuits D1–D2 connected in series.

The output signal n1 of the input buffer IB1 is delayed a predetermined period of time by the delay circuit configured of the delaying gate circuits D1–D2. The output signal of the delay circuit, namely, the output signal n2 of the delaying gate circuit D2 is supplied to the other input terminal of the AND gate circuit AG1.

The output signal n3 of the AND gate circuit AG1 is held at a high level while the output signal n1 of the input buffer IB1 and the output signal n2 of the delaying gate circuit D2 are both at the high level, that is, since the chip select signal $\overline{CS}$ has been brought to a low level thereby to set the output signal n1 of the input buffer IB1 at the high level and until the output signal n2 of the delaying gate circuit D2 becomes the low level following a predetermined delay time. The output signal n3 of the AND gate circuit AG1 is supplied to the clock distribution circuit CD and the timing setting circuit TSC as an internal clock signal. Thus, the delay time of the delay circuit of the pulse transformation circuit PTC as configured of the delayed gate circuits D1–D2 determines the pulse width of the output signal of the AND gate circuit AG1, namely, the internal clock signal n3.

The clock distribution circuit CD is constructed of a plurality of clock amplifiers CA1–CA6 which are connected in a series-parallel form. Each of the clock amplifiers CA1–CA6 is basically constructed of a current switch circuit similarly to each of the delaying gate circuits D1–D2, but the driving ability thereof is heightened. The internal clock signal n3 is somewhat delayed by the clock amplifiers CA1–CA3, the fan-out degrees or load driving powers of which are gradually increased. The output signal of the clock amplifier CA3 is distributed, and is supplied to the input terminals of the clock amplifiers CA4–CA6. The output signal of the clock amplifier CA4 is supplied to the address latch circuits in the X-address buffer XADB and Y-address buffer YADB as the strobe signal for accepting the address signals, namely, the timing signal $\phi_{sa}$ described before. In addition, the output signal of the clock amplifier CA5 is supplied to the data latch circuit in the data input buffer DIB as the strobe signal for accepting the input write data, namely, the timing signal $\phi_{sd}$ described before. The output signal of the clock amplifier CA6 is supplied to the trigger input terminal T of a latch circuit FF1 provided in the mode selection circuit MSL, as the strobe signal for accepting the write enable signal $\overline{WE}$.

The write enable signal $\overline{WE}$ supplied through the external terminal $\overline{WE}$ is supplied to the input terminal of an input buffer IB2 via an input protection circuit not shown. The input buffer IB2 inverts the write enable signal $\overline{WE}$, and converts the level of the inverted signal. The inverted output signal of the input buffer IB2 is supplied to the data input terminal D of the latch circuit FF1.

The latch circuit FF1 of the mode selection circuit MSL is triggered by the strobe signal delivered from the clock amplifier CA6, and is selectively set or reset according to the write enable signal $\overline{WE}$ supplied through the input buffer IB2. More specifically, the latch circuit FF1 is held in the reset state when, with the strobe signal being the write enable signal $\overline{WE}$ is at the high level, the write enable signal $\overline{WE}$ is rendered the high level to bring the output signal of the input buffer IB2 to the low level. On the other hand, the latch circuit FF1 is held in the set state when, with the strobe signal being at the high level, the write enable signal $\overline{WE}$ is rendered the low level to bring the output signal of the input buffer IB2 to the high level. The non-inverted output signal Q of the latch circuit FF1 is supplied via an inverter circuit N1 to an OR gate circuit OG2 in the mode selection circuit MSL.

The timing setting circuit TSC is constructed of a delay circuit which is configured of a plurality of delaying gate circuits D3–D4 connected in series. The timing setting circuit TSC receives the internal clock signal n3, and delays this clock signal n3 a predetermined delay time. As will be described later, the delay time of the timing setting circuit TSC determines the delay time of the write pulse with respect to the chip select signal $\overline{CS}$. The output signal of the timing setting circuit TSC, namely, the output signal n4 of the delaying gate circuit D4 is supplied to the input terminal of a delaying gate circuit D5 in the pulse time width setting circuit PWC.

The pulse time width setting circuit PWC is constructed of a plurality of delaying gate circuits D5–D9 connected in series, and an OR gate circuit OG1. The output signal n4 of the timing setting circuit TSC is gradually delayed by these delaying gate circuits D5–D9, whereby the output signals n5, n6 and n7 of the individual delaying gate circuits are formed. The output signal n7 of the delaying gate circuit D9 is supplied to the first input terminal of the OR gate circuit OG1. Likewise, the output signals n6 and n5 of the delaying gate circuits D8 and D6 are respectively supplied to the second and third input terminals of the OR gate circuit OG1. The fourth input terminal of the OR gate circuit OG1 is supplied with the output signal n4 of the timing setting circuit TSC. The output signal of the OR gate circuit OG1 is set at the high level when any of these output signals n4–n7 is rendered the high level. This output signal n8 of the OR gate circuit OG1 is used as the internal write pulse stated before. Thus, the pulse width of the internal write pulse is determined by the period of time of the high level of any of the output signals n4–n7 in the course in which the output signal n4 of the timing setting circuit TSC is successively delayed by the delaying gate circuits D5–D9. The output signal of the OR gate circuit OG1, namely, the internal write pulse n8 is supplied to one of the complementary input terminals of an inverter circuit N2 in the mode selection circuit MSL.

The inverter circuit N2 of the mode selection circuit MSL includes an emitter-follower output circuit similarly to the inverter circuit N1. The output terminals of these inverter circuits N1 and N2 are coupled to a common input terminal, thereby to construct the OR gate circuit OG2 of wired logic. More specifically, the output signal of the OR gate circuit OG2 is set at the high level when either of the output signals of the inverter circuits N1 and N2 is at the high level, and it is set at the low level when both the output signals of the inverter circuits N1 and N2 are at the low level. The output signal of the OR gate circuit OG2 is further inverted by an inverter circuit N3. The output signal of the inverter circuit N3 is supplied to the write amplifier WA as the write pulse, namely, the timing signal $\phi_w$ stated before. Thus, the timing signal $\phi_w$ is temporarily held at the high level when the output signal of the OR gate circuit OG2 is at the low level, that is, when the non-inverted output signal Q of the latch circuit FF1 and the non-inverted output signal n8 of the OR gate circuit OG1 of the pulse time width setting circuit PWC are both at the high level. The pulse width of this timing signal $\phi_w$ is determined by the delay times of the delaying gate circuits D5-D9 of the pulse time width setting circuit PWC.

Figure 3:
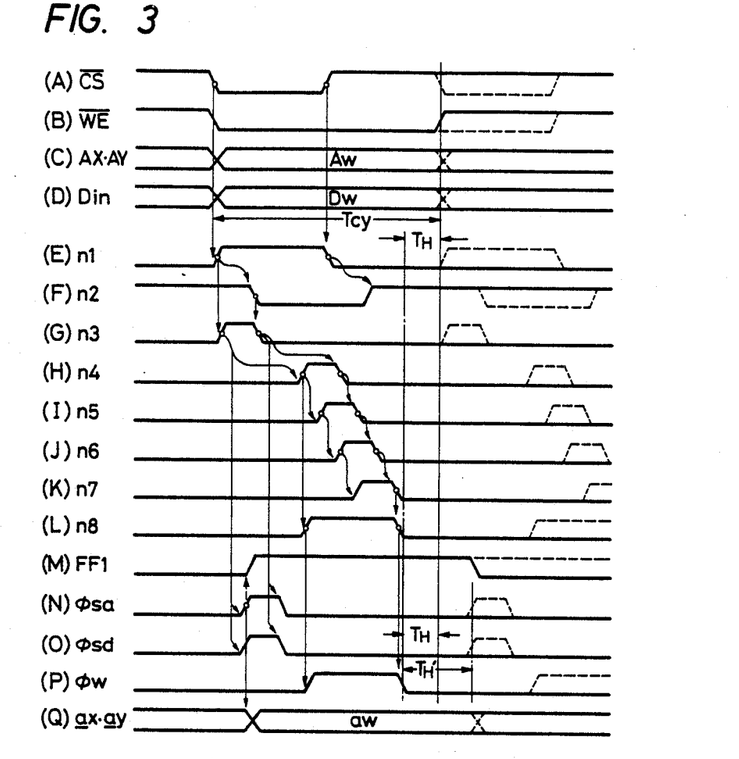
FIG. 3 is a timing chart showing an embodiment of the write operation mode of the bipolar type RAM in FIG. 2.

FIG. 3 shows a timing chart of an example of the write operation mode of the bipolar type RAM in this embodiment. In the figure, the write operation mode of the bipolar type RAM corresponding to one cycle is illustrated by solid lines, and the second write operation mode which succeeds immediately after the end of this memory cycle is illustrated by dotted lines. The write operation mode of the bipolar type RAM of this embodiment will be described with reference to FIG. 3 and FIG. 1.

The bipolar type RAM is started and is brought into the selected state in such a way that the chip select signal $\overline{CS}$ is changed from the high level to the low level as shown at (A) in FIG. 3. The write enable signal $\overline{WE}$ shown at (B) is rendered the low level substantially simultaneously with the change of the chip select signal $\overline{CS}$ to the low level. In addition, the X-address signals AXO-AXi and Y-address signals AYO-AYj are supplied in combinations indicative of write addresses Aw as shown at (C), and the input write data Dw is supplied to the data input terminal Din as shown at (D).

In the bipolar type RAM, in response to the low level of the chip select signal $\overline{CS}$, the output signal n1 (at (E) in FIG. 3) of the input buffer IB1 is first set at the high level, and the output signal n2 (at (F)) of the delaying gate circuit D2 is subsequently set at the low level after the total delay time of the delaying gate circuits D1-D2 of the pulse transformation circuit PTC. Meantime, both the output signal n1 of the input buffer IB1 and that n2 of the delaying gate circuit D2 become the high level, so that the output signal of the AND gate circuit AG1, namely, the internal clock signal n3 (at (G)) is temporarily held at the high level. As stated before, the pulse width of the internal clock signal n3 is determined by the total delay time of the delaying gate circuits D1-D2 of the pulse transformation circuit PTC.

The internal clock signal n3 is supplied to the timing setting circuit TSC, and it is also supplied to the clock distribution circuit CD, thereby to form the timing signals $\phi_{sa}$ and $\phi_{sd}$ which are used as the strobe signals. Thus, the X-address signals AXO-AXi and Y-address signals AYO-AYj, namely, the write addresses Aw are accepted into the address latch circuits within the X-address buffer XADB and Y-address buffer YADB, and the operations of selecting one of the memory cells MC by means of the X-address decoder XDCR and Y-address decoder YDCR are initiated. Besides, simultaneously with the timing signals $\phi_{sa}$ and (shown at (N) and (O)), the output signal of the clock amplifier CA6 is brought to the high level and is supplied to the latch circuit FF1 of the mode selection circuit MSL. Since, on this occasion, the write enable signal $\overline{WE}$ is at the low level, the latch circuit FF1 is brought into the set state, and the non-inverted output signal Q thereof (shown at (M)) becomes the high level.

On the other hand, the internal clock signal n3 is delayed for the predetermined time by a timing setting circuit TSC, and the output signal n4 (at (H)) of the delaying gate circuit D4 is temporarily held at the high level for the same time interval as that of the internal clock signal n3. That is, as seen from (G) and (H) in FIG. 3, the high level of the output signal n4 is delayed with respect to that of the clock signal n3, but the duration thereof is substantially the same as in the clock signal n3. The output signal n4 of the delaying gate circuit D4 is further delayed by the delaying gate circuits D5-D9 of the pulse time width setting circuit PWC, whereby the output signals n5, n6 and n7 (at (I), (J) and (K)) of the respective delaying gate circuits D6, D8 and D9 become the high level in succession. These output signals n7-n4 are applied to the first-fourth input terminals of the OR gate circuit OG1 of the pulse time width setting circuit PWC. The output signal n8 (at (L)) of the OR gate circuit OG1 is brought to the high level in response to the high level of the output signal n4 of the delaying gate circuit D4 of the timing setting circuit TSC, and it is brought back to the low level in response to the low level of the output signal n7 of the delaying gate circuit D9 of the pulse time width setting circuit PWC. The output signal n8 of the OR gate circuit OG1 is supplied to the wired-logic OR gate circuit OG2 via the inverter circuit N2 of the mode selection circuit MSL. Since, on this occasion, the non-inverted output signal Q of the latch circuit FF1 is at the high level, the output signal of the OR gate circuit OG2 is held at the low level for the same time interval as that of the output signal n8 of the OR gate circuit OG1. The output signal of the OR gate circuit OG2 is further inverted by the inverter circuit N3, and the inverted signal is used as the write pulse, namely, the timing signal $\phi_w$ (at (P)) stated before.

Owing to these facts, the write pulse or timing signal $\phi_w$ is set at the high level with a delay which is substantially equal to the delay time of the timing setting circuit TSC, since the chip select signal $\overline{CS}$ has been rendered the low level. Needless to say, the delay time based on the timing setting circuit TSC is designed to correspond to the setup time $t_S$ indicated in FIG. 4. In addition the duration of the high level of the timing signal $\phi_w$, namely, the pulse width thereof is determined by the total delay time of the delaying gate circuits D5-D9 of the pulse time width setting circuit PWC. Needless to say, this total delay time is designed to correspond to the duration $t_W$ of the write pulse indicated in FIG. 4.

Although no special restriction is intended, the chip select signal $\overline{CS}$ is brought back to the high level upon lapse of a suitable time interval since the address signals and the input write data have been accepted into the corresponding latch circuits. The chip select signal $\overline{CS}$ can be brought to the low level again upon lapse of a predetermined time interval since the write pulse or timing signal $\phi_w$ has been changed from the high level back to the low level, whereupon the next memory cycle can be started. This time interval $T_H$ (refer to FIG. 3) is, of course, designed to correspond to hold time $t_H$ in FIG. 4. In the case of the bipolar type RAM of this embodiment, the hold time $T_H$ may be, in effect, a period of time taken until the address selecting operation are started in the next memory cycle, in other words, a period of time $T_H$, taken until the timing signals $\phi_{sa}$ $\phi_{sd}$ are brought to the high level. That is, since the write pulse is autonomously formed by the timing generator circuit TG in the bipolar type RAM, the time relationship between the chip select signal $\overline{CS}$ and the write pulse can be optimized, and the operating speed of a memory such as the bipolar type RAM can be increased.

Figure 5:
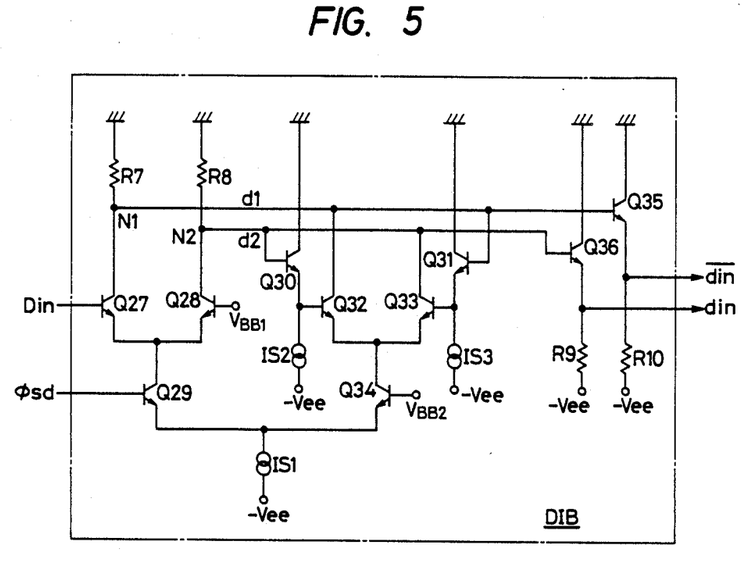
FIG. 5 is a circuit diagram showing an embodiment of a data input buffer DIB.

FIG. 5 shows an embodiment of the data input buffer circuit DIB. Referring to the figure, symbols R7-R10 denote resistors, symbols Q27-Q36 denote N-P-N type bipolar transistors, and symbols IS1-IS3 denote regulated current circuits.

The base of the bipolar transistor Q29 is supplied with the timing signal $\phi_{sd}$ stated before, and that of the transistor Q34 is supplied with a reference voltage $V_{BB2}$ which is formed by a voltage generator circuit not shown. These transistors Q29 and Q34 have their emitters coupled to the power source voltage $-V_{ee}$ through the regulated current circuit IS1, thereby to construct a current switch circuit. More specifically, when the timing signal $\phi_{sd}$ is set at the high level, the transistor Q29 is turned "on" to supply currents to the emitters of the transistors Q27 and Q28. In contrast, when the timing signal $\phi_{sd}$ is set at the low level, the transistor Q34 is turned "on" to supply currents to the emitters of the transistors Q32 and Q33.

The base of the transistor Q27 is supplied with the input data Din, and that of the transistor Q28 is supplied with a reference voltage $V_{BB1}$ which is formed by a voltage generator circuit not shown. When the currents are supplied to the emitters of the transistors Q27 and Q28 in the way described above, these transistors Q27 and Q28 operate as current switches. In more detail, when the input data Din is at the high level, the transistor Q27 falls into the "on" state, whereas the transistor Q28 falls into the "off" state. Thus, an output signal d1 of the low level is produced from the node N1 between the resistor R7 and the collector of the transistor Q27, and an output signal d2 of the high level is produced from the node N2 between the resistor R8 and the collector of the transistor Q28. On the other hand, when the input data Din is at the low level, the transistor Q27 falls into the "off" state, whereas the transistor Q28 falls into the "on" state. Thus, the output signal d1 of the high level is produced from the node N1, and the output signal d2 of the low level is produced from the node N2.

The output signal d1 is delivered as an output signal $\overline{d_{in}}$ through an emitter follower which is configured of the transistor Q35 and the resistor R10, while the output signal d2 is delivered as an output signal $d_{in}$ through an emitter follower which is configured of the transistor Q36 and the resistor R9.

In addition, the output signals d1 and d2 are held in a latch circuit which operates when the timing signal $\phi_{sd}$ is rendered the low level. The latch circuit includes an emitter follower which is configured of the transistor Q31 receiving the output signal d1 and the regulated current circuit IS3, the transistor Q33 which receives the output signal of the emitter follower at its base and which has its collector connected to the node N2, a further emitter follower which is configured of the transistor Q30 receiving the output signal d2 and the regulated current circuit IS2, and the transistor Q32 which receives the output signal of the further emitter follower at its base and which has its collector connected to the node N1. The transistors Q32 and Q33 operate as current switches in response to the low level of the timing signal $\phi_{sd}$. At this time, assuming by way of example that the output signal d1 is at the high level, while the output signal d2 is at the low level, then the transistor Q33 turns "on," and the transistor Q32 turns "off." The node N2 is held at the low level by the "on" state of the transistor Q33, so that the states of the output signals d1 and d2 are held. Even when the output signal d1 is at the low level and the output signal d2 is at the high level, the states of these output signals d1 and d2 are similarly held.

As understood from the above, the data input buffer circuit DIB forms the output signals $d_{in}$ and $\overline{d_{in}}$ conforming to the input data Din when the timing signal $\phi_{sd}$ stated before is set at the high level, and it holds the input data Din and continues to deliver the output signals $d_{in}$ and $\overline{d_{in}}$ conforming thereto when the timing signal $\phi_{sd}$ is set at the low level.

Each of the address latch circuits in the address buffers XADB and YADB described with reference to FIG. 2 has the same arrangement as that of the data input buffer shown in FIG. 5; therefore, a specific circuit thereof is not illustrated since it would be of a similar arrangement as that of FIG. 5. Also the latch FF1 shown in FIG. 1 is arranged similarly to the foregoing data input buffer; therefore, a specific arrangement thereof is also not illustrated in the accompanying drawings.

Figure 6:
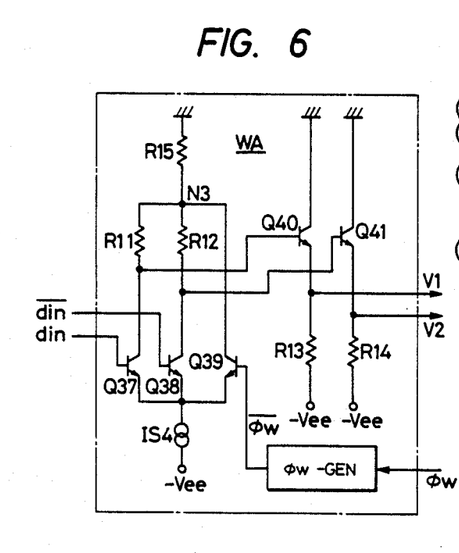
FIG. 6 is a circuit diagram showing an embodiment of a write amplifier WA.

FIG. 6 shows an embodiment of the write amplifier WA. Referring to the figure, symbols R11–R15 denote resistors, symbols Q37–Q41 denote N-P-N type bipolar transistors, and symbol IS4 denotes a regulated current circuit.

The base of the transistor Q37 is supplied with the output signal $d_{in}$ stated before, and the collector thereof is coupled to the ground potential of the circuitry through the resistors R11 and R15. The transistor Q38 has its base supplied with the output signal $\overline{d_{in}}$ stated before, and has its collector coupled through the resistor R12 to the node N3 between the resistors R11 and R15. In addition, the transistor Q39 has its base supplied with the inverted signal $\overline{\phi_w}$ of the write pulse $\phi_w$ and has its collector coupled to the node N3. The emitters of these transistors Q37–Q39 are made common, and are coupled to the power source voltage $-V_{ee}$ through the regulated current circuit IS4. The inverted write pulse $\overline{\phi_w}$ is formed by a timing signal generator circuit $\overline{\phi_w}$-GEN which receives the timing signal (write pulse) $\phi_w$ stated before and which subjects this timing signal $\phi_w$ to phase inversion and level conversion.

An emitter follower is configured of the transistor Q40 and the resistor R13, the base of the transistor Q40 is coupled to the collector of the transistor Q37, and the emitter of this transistor Q40 is coupled to the signal line V1 stated before. Likewise, an emitter follower is configured of the transistor Q41 and the resistor R14, the base of the transistor Q41 is coupled to the collector of the transistor Q38, and the emitter of this transistor Q41 is coupled to the signal line V2 stated before.

Figure 7:
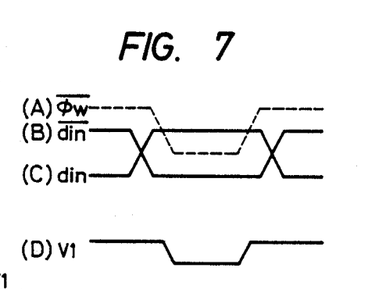
FIG. 7 is a waveform diagram showing the operating waveforms of the write amplifier WA.

FIG. 7 shows the operating waveforms of the write amplifier WA. Now, the operation of the write amplifier WA will be described with reference to FIGS. 6 and 7.

In the case where the bipolar type RAM is in the read mode, the write enable signal $\overline{WE}$ is set at the high level, and hence, the timing signal $\phi_w$ stated before becomes the low level. In response to this timing signal $\phi_w$, the timing generator circuit $\overline{\phi_w}$-GEN forms the timing signal $\overline{\phi_w}$ having a level higher than the output signals $\overline{d_{in}}$ and $\overline{d_{in}}$ (at (B) and (C) in FIG. 7) as illustrated at (A) in FIG. 7. Thus, the transistor Q39 turns "on," and the transistors Q37 and Q38 turn "off." Therefore, the bases of the respective transistors Q40 and Q41 are supplied with potentials which are substantially equal to the potential of the node N3, and the potentials of the respective signal lines V1 and V2 become the intermediate level as described before.

In contrast, in the case where the bipolar type RAM is brought into the write mode, the write enable signal $\overline{WE}$ is set at the low level. Thus, the timing generator circuit $\overline{\phi_w}$-GEN forms the timing signal $\overline{\phi_W}$ having a level intermediate between the levels of the signal $d_{in}$ and the signal $\overline{d_{in}}$ as illustrated at (A) in FIG. 7. On this occasion, when the signal $d_{in}$ is at the high level and the signal $\overline{d_{in}}$ is at the low level in accordance with the input data Din by way of example, the transistor Q37 turns "on," and the transistor Q38 turns "off." As a result, the potential of the signal line V1 changes from the aforementioned intermediate level to the low level, and that of the signal line V2 is held substantially at the intermediate level.

In this way, the write amplifier supplies the intermediate level to the signal lines V1 and V2 in the read mode. In contrast, in the case of the write mode, the potential of the signal line V1 or V2 is rendered the low level in accordance with the input data Din by the write amplifier WA, with the result that the input data Din is written into the bipolar memory cell MC.

As thus far described, the bipolar type RAM of this embodiment is provided with latch circuits for accepting and holding a write enable signal $\overline{WE}$, address signals and input write data in accordance with strobe signals, and a timing generator circuit TG for forming the strobe signals and a write pulse necessary for a write operation on the basis of a chip select signal $\overline{CS}$ which is supplied from outside. The write enable signal $\overline{WE}$ is supplied at the same timing as those of the address signals and the input write data. In the timing generator circuit TG, a strobe signal is formed somewhat later than the chip select signal $\overline{CS}$, and the latch circuit FF1 of the timing generator circuit TG is triggered by this strobe signal and is selectively set or reset according to the write enable signal $\overline{WE}$. In addition, the write pulse $\phi_w$ is selectively formed according to the state of the latch circuit FF1 while keeping predetermined time relations relative to the chip select signal CS. These time relations are optimized so that the memory cycle of the bipolar type RAM may become minimized. Thus, timing conditions for the write enable signal $\overline{WE}$ of the bipolar type RAM are moderated, and the memory cycle of the RAM is shortened.

As disclosed in the foregoing embodiment, in a case where this invention is applied to a high-speed semiconductor memory device such as bipolar type RAM, the following effects are attained: (1) A bipolar type RAM is provided with latch circuits which accept and hold address signals, input write data and a write control signal (write enable signal) supplied from outside, in accordance with strobe signals, and a timing generator circuit TG which forms the strobe signals and a write pulse necessary for a write operation on the basis of a start control signal (chip select signal) supplied from outside, thereby to bring forth the effect that the write pulse subject to comparatively severe timing conditions can be formed inside the bipolar type RAM relatively easily. (2) Owing to the above item (1), there is produced the effect that the time relations between the start control signal and the write pulse can be optimized, and that the memory cycle of the bipolar type RAM can be shortened. (3) Owing to the above items (1) and (2), there is produced the effect that the write pulse can be stably supplied, and that the erroneous write operations of the bipolar type RAM can be prevented. (4) Owing to the above items (1) and (2), there is produced the effect that the timing conditions of the write control signal relative to the start control signal can be moderated, and that the arrangement of a peripheral equipment such as memory controller can be simplified. (5) Owing to the above items (1)-(4), there is produced the effect that the throughput of a computer system or the like including the bipolar type RAM can be enhanced, and that the cost of the system can be curtailed with the reliability thereof heightened. (6) A bipolar type RAM includes a circuit (a kind of level change detector circuit) which forms a pulse in response to the level change of a start control signal, and a circuit which determines the pulse width (duration) of a write pulse on the basis of the formed pulse. Thus, it becomes possible to provide the bipolar type RAM which is less liable to be affected by the pulse width (duration) of the start control signal supplied from outside. (7) The respective circuits in the above item (6) are formed simultaneously with the other circuits (for example, memory cells) o an identical semiconductor chip. Therefore, even when the characteristics of the memory cells etc. vary due to manufacture deviations, also the characteristics of the respective circuits in the item (6) vary similarly. Thus, even when the characteristics of the memory cells etc. vary, the pulse width of the write pulse varies accordingly, and it is possible to lessen the malfunctions of the bipolar type RAM. (8) A bipolar type RAM includes a circuit which forms a pulse having a pulse width shorter than that of a start control signal, in response to the level change of the start control signal, and a circuit which forms a write pulse in case of a write operation, on the basis of the first-mentioned pulse. Thus, the write pulse which is less liable to be affected by the duty of the start control signal from outside can be formed in the case of the write operation, and it is therefore possible to simplify the peripheral circuits of the bipolar type memory.

Although, in the above, the invention made by the inventors has been specifically described in conjunction with particular embodiments, it is needless to say that this invention is not restricted to the foregoing embodiments, but that it can be variously modified within a scope not departing from the purport thereof. By way of example, in the timing generator circuit TG in FIG. 1, the number of stages of the delaying gate circuits constituting each delay circuit or the combination of the various logical gate circuits may be any other number or combination. Besides, the arrangement of the pulse time width setting circuit PWC may well be a simple one configured of, for example, one set of delay circuits and a 2-input OR gate circuit. Further, as the control signals which are supplied from outside, block select signals or the likes may well be supplied in addition to the chip select signal $\overline{CS}$, and the start control signal as well as the write control signal may well be otherwise named. In the circuit block diagram of the bipolar type RAM in FIG. 2, the memory cell MC may well be such that each of the P-N-P type load transistors has a high resistance connected in parallel therewith or that each of the P-N-P type load transistors is replaced with a resistor and a clamp diode connected in parallel, or it may well be constructed of a CMOS (complementary MOS) circuit. In addition, the memory array M-ARY may well be configured of a plurality of memory mats. Further, various aspects of performance can be adopted for the practicable circuit arrangement of the timing generator circuit TG shown in FIG. 1, the block arrangement of the bipolar type RAM shown in FIG. 2, the combinations of the control signals and the timing signals, etc.

In the foregoing, the invention made by the inventors has been chiefly described as to the case of application to the bipolar type RAM which forms the background field of utilization thereof. However, the invention is not restricted thereto, but it is also applicable to, for example, an ultrahighspeed RAM which is basically made of a metallic compound semiconductor such as GaAs (gallium arsenide). The present invention can be extensively utilized for a semiconductor memory device in which, at least, a write operation is selectively executed in accordance with a write control signal supplied from outside, and a digital equipment which includes such a semiconductor memory device.

Effects which are attained by a typical aspect of performance of this invention are briefly explained as follows: A bipolar type RAM is provided with latches which accept and hold address signals, input write data and a write control signal (write enable signal) supplied from outside, in accordance with strobe signals, and a timing generator circuit TG which forms the strobe signals and a write pulse necessary for a write operation on the basis of a start control signal (chip select signal) supplied from outside, whereby the time relations between the start control signal and the write pulse can be optimized, and the memory cycle of the bipolar type RAM can be shortened, and besides, the throughput of a computer system or the like including such a semiconductor memory device can be enhanced, and the reliability thereof can be improved.

What is claimed is:

1. A semiconductor memory device comprising:
   a plurality of selectively activated memory cells;
   a first external terminal which is supplied with a write control signal for instructing a write operation;
   a second external terminal which is supplied with write data;
   a third external terminal which is supplied with a select signal for effecting selection of said semiconductor memory device at least for a write operation;
   first timing signal generation means, being coupled to said third external terminal, for providing a strobe signal in response to said select signal;
   first holding means, being coupled to said first external terminal and said first timing signal generation means, for holding said write control signal in response to said strobe signal;
   second timing signal generation means, being coupled to both said first holding means and said first timing signal generation means, for providing a write pulse; and
   write means, being coupled to receive said write pulse and having an input coupled to said second external terminal and an output coupled to said plurality of memory cells, for subjecting a selected one of said memory cells to the write operation in response to receiving said write pulse so that the selected one of said memory cells stores in data in accordance with the write data being received at said second external terminal.

2. A semiconductor memory device according to claim 1, wherein said each memory cell comprises, at least, a pair of bipolar transistors whose bases and collectors are cross-connected to each other.

3. A semiconductor memory device according to claim 2, wherein said first timing signal generation means comprises pulse formation means for forming a timing signal having a predetermined pulse width when a potential of said third external terminal has changed to a potential instructive of the selection of said semiconductor memory device, and strobe signal formation means for forming said strobe signal in response to the output of said pulse formation means.

4. A semiconductor memory device according to claim 3, wherein said second timing signal generation means comprises write pulse formation means for receiving said timing signal formed by said pulse formation means and the output of said first holding means, to form said write pulse having a predetermined pulse width after a predetermined time interval since said select signal has been supplied to said third external terminal.

5. A semiconductor memory device according to claim 4, wherein said write means is comprised of second holding means, having an input coupled to said second external terminal, for holding said write data in accordance with said strobe signal, and write amplifier means, coupled to an output of said second holding means, for providing write data to the selected one of said memory cells in response to said write pulse.

6. A semiconductor memory device according to claim 5, comprising a plurality of addressing external terminals for receiving a plurality of address signals; third holding means, coupled to said addressing external terminals, for holding said address signals in accordance with said strobe signal; and selection means, coupled to an output of said third holding means and the plurality of memory cells, for selecting a memory cell conforming to the address signals from among said memory cells.

7. A semiconductor memory device according to claim 2, wherein said write means is comprised of second holding means, having an input coupled to said second external terminal, for holding said write data in response to an input write data strobe signal, and write amplifier means, coupled to an output of said second holding means, for providing write data to the selected one of said memory cells in response to said write pulse.

8. A semiconductor memory device according to claim 7, wherein said input write date strobe signal is substantially the same in pulse width and time of occurrence as said strobe signal, applied to said first holding means, and is provided by said first timing signal generation means.

9. A semiconductor memory device according to claim 2, comprising a plurality of addressing external terminals for receiving a plurality of address signals; second holding means, coupled to said addressing external terminals, for holding said address signals in response to an address strobe signal; and selection means, coupled to an output of said second holding means and the plurality of memory cells, for selecting a memory cell conforming to the address signals from among said memory cells.

10. A semiconductor memory device according to claim 9, wherein said address strobe signal is substantially the same in pulse width and time of occurrence as said strobe signal, applied to said first holding means, and is provided by said first timing signal generation means.

11. A semiconductor memory device according to claim 1, wherein said memory cells comprise:
   a plurality of random access memory cells arranged in rows and columns of memory cells, wherein each row of memory cells is associated with a word line select signal provided in accordance with a row address decoding signal and an address strobe signal and each column of memory cells is associated with a pair of complementary data lines which are selectively coupled to an output of said write means in accordance with a column address decoding signal and said address strobe signal.

12. A semiconductor memory device according to claim 11, wherein said each memory cell comprises, at least, a pair of bipolar transistors whose bass and collectors are cross-connected to each other.

13. A semiconductor memory device according to claim 12, wherein each memory cell comprises first and second multi-emitter NPN transistors, and first and second PNP transistors, said first NPN transistor having an emitter commonly connected to an emitter of said second NPN transistor and to a current sink, another one of the emitters of said first and second NPN transistors being respectively coupled to one of the associated complementary data lines, the base and collector of said first NPN transistor being coupled to the collector and base of said second NPN transistor, respectively, and respectively to the collector and base of said first PNP transistor, the collector and base of said second NPN transistor being coupled to the base and collector of said second PNP transistor, and the emitters of said first and second PNP transistors being coupled to an associated row word line.

14. A semiconductor memory device according to claim 13, wherein said write means includes series connection of a data input buffer and a write amplifier, said data input buffer holds write data received from said second external terminal in response to an input write data strobe signal from said first timing signal generation means, and said write amplifier provides write data to a selected pair of complementary data lines in response to said write pulse.

15. A semiconductor memory device according to claim 14, wherein said address and input write data strobe signals are substantially the same in pulse width and time of occurrence as said strobe signal, applied to said first holding means, and are provided by said first timing signal generation means.

16. A semiconductor memory device according to claim 1, wherein said write means includes a series connection of a data input buffer and a write amplifier, said data input buffer holds write data received from said second external terminal in response to an input write data strobe signal from said first timing signal generation means, and said write amplifier provides write data to a selected pair of complementary data lines in response to said write pulse.

17. A semiconductor memory device according to claim 16, wherein said input write data strobe signal is substantially the same in pulse width and time of occurrence as said strobe signal, applied to said first holding means, and is provided by said first timing signal generation means.

18. A semiconductor memory device comprising a timing generator circuit for controlling at least a write operation of said memory device by which, on the basis of a start control signal supplied from outside, a write pulse having a predetermined pulse width and held in a predetermined time relationship with respect to said start control signal is formed selectively according to a write control signal supplied from outside; and a write amplifier by which a write signal is supplied selectively according to said write pulse, wherein said timing generator circuit includes; a pulse transformation circuit having an input and an output and including first means for detecting a level change of said start control signal and providing an internal clock signal having a predetermined time width in accordance with said level change; a clock distribution circuit having an input, coupled to the output of said pulse transformation circuit, and having an output, and including second means for transforming said internal clock signal into a strobe signal; a latch circuit having a trigger input, coupled to receive said strobe signal, and including third means for providing, in response to said strobe signal, an output signal at an output of said latch circuit indicative of said latch circuit being selectively placed in a set or reset operating state in accordance with said write control signal; a timing setting circuit having an input, coupled to the output of said pulse transformation circuit, and having an output, and including fourth means for delaying said internal clock signal for p predetermined time interval with respect to said start control signal; a pulse time width setting circuit having an input, coupled to the output of said timing setting circuit, and having an output, and including fifth means for providing an internal pulse having a predetermined time width in accordance with receiving the output signal of said timing setting circuit; and mode selection means, coupled to the output of both said latch circuit and said pulse width setting circuit, for selectively transmitting said internal pulse in accordance with the output signal received from said latch circuit, thereby to selectively form said write pulse and control said write amplifier.

19. A semiconductor memory device according to claim 18, further comprising address latch means for accepting and holding address signals supplied from outside, in accordance with said strobe signal; and a data latch means which accepts and holds write data supplied from outside, in accordance with said strobe signal, said data latch means having an input coupled to receive said write data and an output coupled to an input of said write amplifier, wherein inputted write data is selectively written in respective ones of a plurality of memory cells, constituting a memory portion of said semiconductor memory device, in response to said address signals.

20. A semiconductor memory device according to claim 19, wherein said semiconductor memory device is a bipolar type RAM.

21. A semiconductor memory device according to claim 18, further comprising address latch means which accept and hold address signals supplied from outside, in accordance with an address strobe signal; and a data latch means which accepts and holds write data supplied from outside, in accordance with an input write data strobe signal, said data latch means having an input coupled to receive write data and an output coupled to an input of said write amplifier, wherein input write data is selectively written in respective ones of a plurality of memory cells, constituting a memory portion of said semiconductor memory device, in response to said address signals.

22. A semiconductor memory device according to claim 21, wherein said data latch means is series coupled with said write amplifier between a write data input terminal and said plurality of memory cells.

23. A semiconductor memory device according to claim 22, wherein said semiconductor memory device is a bipolar type RAM having a plurality of rows and columns of memory cells; a plurality of word lines and complementary pairs of data lines; and row and column selection circuits, wherein each memory cell is disposed between a corresponding word line and a pair of complementary data lines; and wherein said write amplifier has an output selectively coupled to a respective one of said complementary pairs of data lines and a respective memory cell associated therewith in accordance with a selection effected by said row and column selection circuits.

24. A semiconductor memory device according to claim 23, wherein each row of memory cells is associated with a word line select signal provided from said row selection circuit in accordance with a row address decoding signal and said address strobe signal, and each column of memory cells is associated with a pair of complementary data lines which are selectively coupled to an output of said write amplifier in accordance with a column select signal provided from said column selection circuit in response to a corresponding column address decoding signal and said address strobe signal.

25. A semiconductor memory device according to claim 20, wherein said address and input write data strobe signals are substantially the same in pulse width and time of occurrence as said strobe signal which is applied to trigger said latch circuit into a set or reset state in accordance with said write control signal, said address and input write data strobe signals being provided by said second means.

* * * * *